United States Patent
Brachmann et al.

(10) Patent No.: US 6,351,154 B2
(45) Date of Patent: *Feb. 26, 2002

(54) PHASE DETECTOR

(75) Inventors: Markus Brachmann; Hans-Joachim Goetz, both of Nuremberg (DE)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/363,528

(22) Filed: Jul. 29, 1999

(30) Foreign Application Priority Data

Aug. 4, 1998 (EP) .............................. 98306189

(51) Int. Cl.⁷ .............................. H04L 7/02; H04L 7/00
(52) U.S. Cl. .............................. 327/12; 327/3; 327/159; 327/2
(58) Field of Search .............................. 327/1, 2, 5, 7, 327/8, 12, 218, 141, 142, 143, 156, 159, 147, 150

(56) References Cited

U.S. PATENT DOCUMENTS

| | | | |
|---|---|---|---|
| 4,378,509 A | | 3/1983 | Hatchett et al. ............... 327/5 |
| 4,426,714 A | * | 1/1984 | Ashida ........................... 327/2 |
| 5,459,765 A | * | 10/1995 | Ashida ........................... 327/12 |
| 5,592,110 A | | 1/1997 | Noguchi ........................ 327/12 |

FOREIGN PATENT DOCUMENTS

| | | | |
|---|---|---|---|
| DE | 40 16429 A1 | 5/1990 | ........... H03L/7/085 |
| JP | 56080730 | 5/1981 | ............ H03K/5/26 |

OTHER PUBLICATIONS

C. Vissiere "Synthese de frequence: une nouvelle generation de circuits integres" Toute L'Electromique No. 489, Dec. 1983, pp. 33–35.

European Research Report dated Jan. 14, 1999.

* cited by examiner

*Primary Examiner*—Dinh T. Le
(74) *Attorney, Agent, or Firm*—Christopher S. Buckley; Ozer M. N. Teitelbaum

(57) ABSTRACT

A phase detector including a voltage controlled oscillator generating a voltage controlled oscillator output, and a first logic state device for receiving said voltage controlled oscillator output as an input. The phase detector also includes a reset device, for generating a reset signal to reset the first logic state device such that the output control signal of the first logic state device reaches a low level in response to a first edge of the reset signal.

17 Claims, 2 Drawing Sheets

PHASE DETECTOR

CROSS-REFERENCE TO RELATED APPLICATION

This application claims priority of European Patent Application No. 98306189.6, which was filed on Aug. 04, 1998.

TECHNICAL FIELD

The present invention relates generally to the field phase detectors and particularly to a phase detector being formed by a flip-flop.

BACKGROUND OF THE INVENTION

Phase detectors realized with a flip-flop are known in the art. German Patent DE 40 16 429 C2, which is incorporated by reference herein, shows a phase detector being realized with a D-type flip-flop. A feedback clock is coupled to a clock input of the flip-flop. A reference clock is coupled via a mono-flop, which generates a pulse, to asynchronously reset the input of the flip-flop. The output of the flip-flop is a control signal for controlling, such as, for example, a voltage controlled oscillator. The data input of the flip-flop is coupled to the inverted output of the flip-flop.

Referring to FIG. 1, a phase locked loop (PLL) having the known phase detector is illustrated. The PLL consists of a voltage controlled oscillator 1, a PLL filter, a D-type flip-flop 2 forming the known phase detector, a low pass filter 3 and a mono-flop 4. A clock signal FB produced by the voltage controlled oscillator 1, being the feedback dock, is coupled to a clockk input C of flip-flop 2 and a pulse RES. derived, for example from the rising edge of a reference clock REF by mono-flop 4, is coupled to an asynchronous reset input R of flip-flop 2. A data input D of flip-flop 2 is coupled to an inverse output Q' of the flip-flop 2. Therefore, an output signal OUT at output Q of the flip-flop 2, forms a control signal which goes to a high level, such as a system voltage, with the rising edge of the feedback clock FB, and goes to a low level with the rising edge of the reference clock REF.

The output signal OUT is filtered by the low pass filter 3 consisting of a resistor R1 and a capacitor C1, and forms a control signal OUT3 for the voltage controlled oscillator 1, which corresponds to the mean value of the output signal OUT, formed by the low pass filter 3. A useful nominal operating point is given by a duty cycle of 1:1. Other operating points are also possible. Phase delay between the reference clock REF and the feedback clock FB is then given with a phase of $\pi$ in a locked high gain PLL circuit.

In case of a reference clock REF failure the signal RES goes inactive, the flip-flop 2 works as a divider by two. Therefore the output signal OUT has a duty cycle of exactly 1:1, i.e. the phase detector 2 works at the nominal operating point. For that reason the phase detector formed by flip-flop 2 is self biasing in case of loss of the reference clock REF.

FIG. 2 shows the transfer function of the phase detector, i.e. the phase deviation $\phi$ of reference clock REF to feedback clock FB versus the filtered phase detector output signal OUT3. The phase detector uses almost the whole phase deviation from O to $2\pi$ for detection. There is only a small and well defined dead-zone Z caused by the pulse width of the reset pulse RES derived from the reference clock REF by mono-flop 4. As long as the reset pulse RES is active, the feedback clock FB on the clock input C of the flip-flop 2 cannot set the output Q of the flip-flop 2. Therefore, the state of output Q is well defined under all conditions, including a phase difference 0 of reference and feedback clock.

However, the proposed generation of the reset pulse RES for the phase detector flip-flop 2 has the disadvantage, that the mono-flop 4 has to be dimensioned in a way that the reset pulse RES generated is neither to short nor to long. If it is to short the phase detector flip-flop 2 will not be reset. If it is too long the dead-zone Z will be unnecessarily long. In addition it has to be secured, so that no matter how the reference clock signal REF fails—static high or static low, the signal at the reset input R of the phase detector flip-flop 2 goes inactive (low).

Another drawback of the known phase detector flip-flop 2 is that a skew (phase error) is present. The skew depends on the different delay times of the clock to data valid transition, i. e. the delay caused by the phase detector flip-flop 2 after a rising edge of the feedback clock FB, and of the reset to data valid transition, i. e. the delay caused by the mono-flop 4 and the phase detector flip-flop 2 after a rising edge of the reference clock REF.

SUMMARY OF THE INVENTION

Accordingly, it is an object of the present invention to provide a phase detector being formed by a flip-flop. It is the aim of the inventive phase detector under consideration to avoid the drawbacks known from the state of the art.

The object is achieved by providing a phase detector having a D-flip-flop with a first output for a control signal, a first input for a feedback clock, a second input for a pulse, generated from a reference clock and a third input to which a second output is coupled, by a gate for generating the pulse from the reference clock and that an output of said gate is coupled back to an input of said gate.

An advantage of the present invention is that it provides a reset pulse for a phase detector being formed by a D-flip-flop that has an optimum width, without the necessity of explicitly dimensioning it. Another advantage of the present invention is that it allows the design of a skewless phase detector.

The present invention will become more fully understood from the detailed description given hereinafter and further scope of applicability of the present invention will become apparent. However, it should be understood that the detailed description is given by way of illustration only, since various changes and modifications within the spirit and scope of the invention will become apparent to those skilled in the art.

BRIEF DESCRIPTION OF THE DRAWINGS

The following detailed description is accompanied by drawings of which

Identical denotations in different Figures represent identical elements.

DETAILED DESCRIPTION

Figure 1:
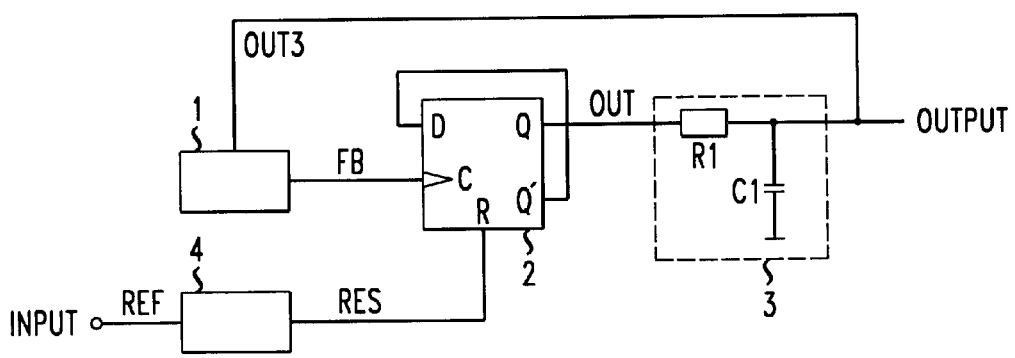
FIG. 1 is a schematic diagram of a phase detector known form the state of the art.
Figure 2:
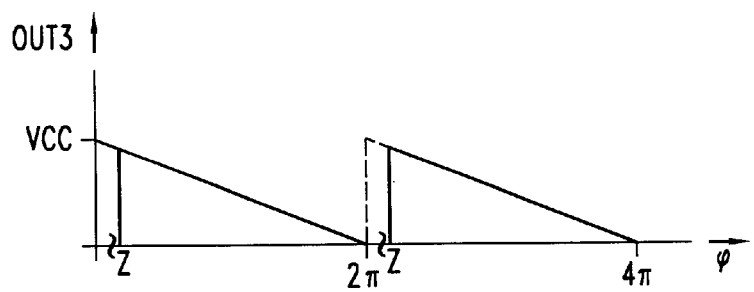
FIG. 2 is a graph of the transfer function of the phase detector of FIG. 1.

Depicted in FIG. 1 is a phase locked loop as described in the opening portion having a phase detector formed by a D-flip-flop 2, a voltage controlled oscillator 1, a PLL-filter 3 and a gate 4 for generating a reset pulse RES from a reference clock REF. The reset pulse RES is coupled to a reset input R of the flip-flop 2. The function of gate 4 for generating the reset pulse RES according to this invention will now be explained for two embodiments with reference to FIGS. 3 and 4.

Figure 3:
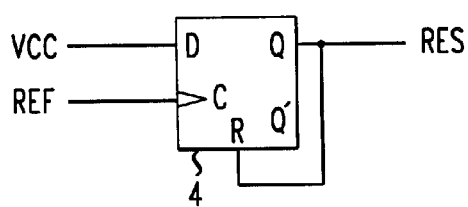
FIG. 3 is a schematic diagram of a first embodiment of a gate for generating a reset pulse for the phase detector according to this invention.

FIG. 3 shows a schematic diagram of a first embodiment of a gate 4 for generating a reset pulse RES from the reference clock REF. Gate 4 for generating the reset pulse RES is formed by a D-flip-flop. The reference clock REF is coupled to a clock input C of the flip-flop 4. A high level, e.g. a system voltage VCC, is coupled to a data input D of the flip-flop 4. At an output Q of the flip-flop 4 the reset pulse RES is available. The output Q is also coupled back to a reset input R of the flip-flop 4. The back coupled output Q therefore immediately resets the flip-flop 4 each time a high signal is present at the output Q, i.e. after a rising edge of the reference clock. In that way a reset pulse RES is produced having a width equivalent to the delay time of the flip-flop 4.

Figure 4:
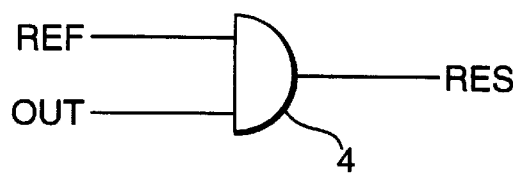
FIG. 4 is a schematic diagram of a second embodiment of a gate for generating a reset pulse for the phase detector according to this invention.

FIG. 4 shows a schematic diagram of a second embodiment of a gate 4 for generating a reset pulse RES from the reference clock REF. Gate 4 for generating the reset pulse RES is formed by an AND-gate. The reference clock REF is coupled to a first input of AND-gate 4. The output signal OUT of the phase detector flip-flop 2 of FIG. 1 is coupled to a second input of the AND-gate 4. At an output of the AND-gate 4 the reset pulse RES is available. The back coupled output signal OUT of the phase detector flip-flop 2 thus is "anded" with the reference signal REF. The output of the AND-gate 4 goes high with REF going high and forms the reset pulse RES that resets the phase detector flip-flop 2. After reset of the phase detector flip-flop 2 the output signal OUT of the phase detector flip-flop 2 goes low and thus the output of the AND-gate 4. In that way a reset pulse RES is produced having a width equivalent to the delay time of the phase detector flip-flop 2 and the delay time of the AND-gate 4.

As can be seen from the two different embodiments explained above, it is possible by coupling back the output signal RES of gate 4 or a signal derived from the output signal RES to an input of gate 4, to produce a reset signal RES having an optimum reset pulse width. Because the components of gate 4 are realized in the same technology as used as for the components of the phase detector flip-flop 2, the pulse width has the minimum width necessary for the reset of the phase detector flip-flop 2.

Figure 5:
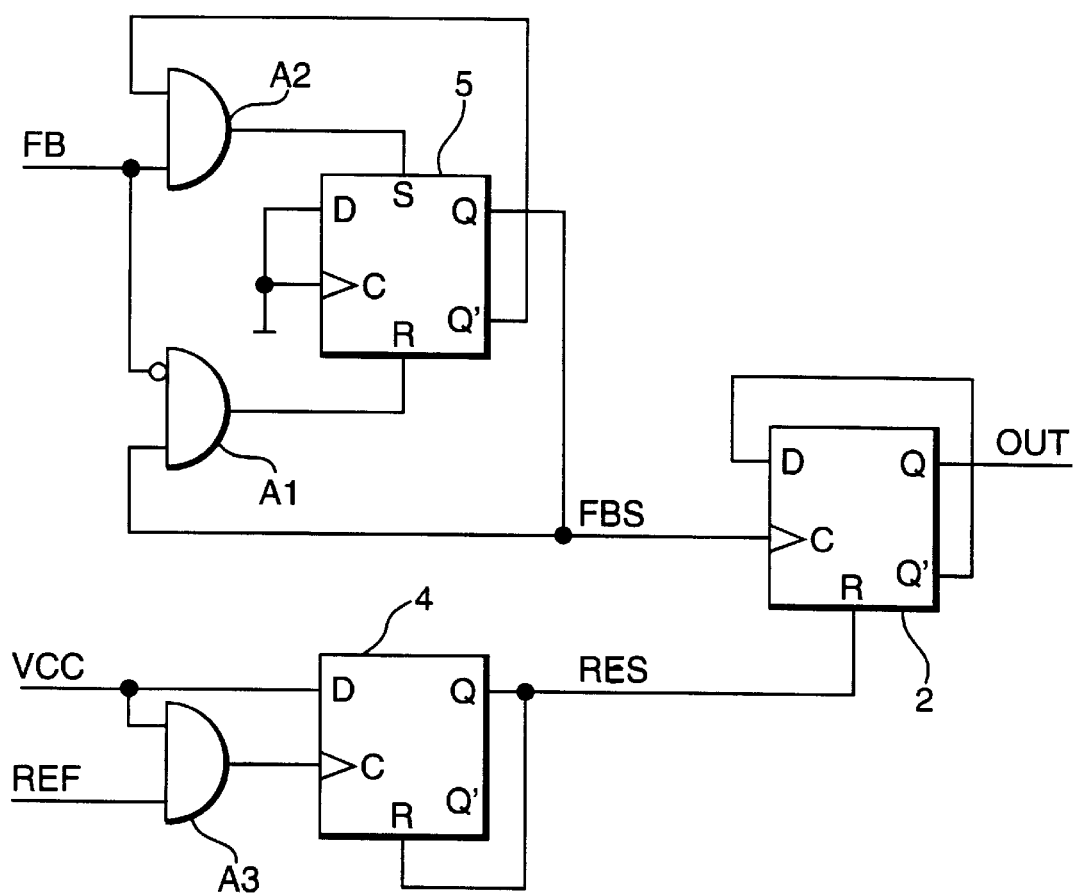
FIG. 5 is a schematic diagram of a skewless phase detector according to this invention.

Now reference is made to FIG. 5 which shows a schematic diagram of a skewless phase detector, having a phase detector D-flip-flop 2, a D-flip-flop 4 for generating the reset pulse RES form the reference clock REF, a third D-flip-flop 5, an AND-gate A1 having an inverted input and two AND-gates A2 to A3. Flip-flop 2 is the phase detector flip-flop as known from the above explanations. Flip-flop 4 generates the reset pulse RES for the phase detector flip-flop 2 from the rising edge of the reference clock REF. With the rising edge of the reference clock REF, the signal RES goes high. As the output Q of the flip-flop 4 is directly fed back to the reset input R, the output will go low as soon as the flip-flop 4 goes high.

The pulse width of the reset signal RES only depends on the reset input R to output Q data valid delay time. Flip-flop 5, which data input D and clock input C are coupled to a low level, is used to minimize the phase detector output skew. Looking at the phase detector flip-flop 2, the output skew depends on the different delay times of 'clock to data valid' (C2D) and 'reset to data valid' (R2D). The delay time for the rising edge of the reference clock REF to the falling edge of the output signal OUT (REF2OUT) is the sum of the delay time of AND-gate A3 and the delay times of 15 'clock to data valid' and 'reset to data valid' (A3+R2D+C2D). In order that the delay time of the rising edge of the feedback clock FB to the rising edge of the output signal OUT (FB2OUT) is equal to the delay time REF2OUT, a delay time R2D+A3 has to be added to the path of the feedback clock FB (FB2OUT). This is achieved with the help of flip-flop 5. Assuming that the 'set to data valid' (S2D) delay equals the 'reset to data valid' delay (R2D), flip-flop 5 adds exactly the same delay time. The output of flip-flop 5 is set by the rising edge of the feedback clock FB and reset by coupling back outputs Q and Q' of flip-flop 5 via AND-gates A2 and A1 to the set and reset inputs S and R respectively. The additional AND-gate A3 is used only to delay the reference clock REF to compensate for the delay time of AND-gate A2 in the path of the feedback clock FB.

The phase detectors as explained above can be implemented as integrated circuits (ICs) or with discrete components. The logic structure of the phase detector guarantees, that the delays of the signal paths of the input signals FB and REF, caused by the phase detector, will be equalized. If it is assured that like logic elements have like signal delays, the delays for the input signals FB and REF are equalized. For achieving maximum advantage of the phase detector as explained above, it should be implemented in a monolithic structure, e.g. ASIC, PLD, FPGA etc. In that case no additional efforts, like defining timing constraints will be necessary, as the skew of a phase detector realized in a monolithic structure is already minimized.

For reason of testability it sometimes is desirable to test the characteristics of the phase detector in the absence of the reference clock REF. This can easily be achieved for a phase detector having a gate 4 as shown in FIGS. 3 to 5 by coupling a low level signal to input VCC. For a phase detector having a gate 4 as shown in FIG. 4, this can be easily achieved by using an AND-gate having an additional input. In operational mode a high level signal is coupled to the additional input, whereas in test mode a low level signal is coupled to the additional input.

As explained in the incorporated document DE 40 16 429 C2, instead of the asynchronous reset input R used with the phase detector flip-flop 2 also an asynchronous set input can be used.

In addition it should be understood that a phase detector as explained above also could be realized by inverting all logical levels and inputs of the components used to achieve the same operability.

What is claimed is:

1. A phase locked device comprising:
   a voltage controlled oscillator for generating a VCO signal;
   a first logic device:
   for receiving said VCO signal;
   for generating a first logic device output control signal receive by said voltage control oscillator, said first logic state device output control signal reaching a first level responsive to a first edge of said voltage controlled oscillator output; and
   for generating an inverse first logic device output control signal input receive by said first logic state device as a data input; and
   a reset device, having a first device delay time, for generating a reset signal to reset said first logic device, said first logic device output control signal reaching a second level responsive to a first edge of said reset signal, such that said reset signal has a width about equal to said first device delay time.

2. The phase locked loop device of claim 1, wherein said reset device comprises a second logic device, having a second device delay time, for receiving a reference input signal and generating a second logic device output signal, said second logic device generating:

a reset control signal, responsive to said reset signal, for resetting said second logic device; and said second logic device output signal, responsive to said reference input signal, for generating said reset signal to reset said first and second logic devices, such that said width of said reset signal is about equal to said second device delay time.

3. The phase locked loop device of claim 2, wherein at least one of said first and second logic devices comprises a D-type flip flop.

4. The phase locked loop device of claim 3, wherein said voltage controlled oscillator, said first logic state device, and said reset device are formed on a singular substrate.

5. The phase locked loop device of claim 2, further comprising a filter for filtering said first logic device output control signal between said first logic device and said voltage controlled oscillator.

6. The phase locked loop device of claim 1, wherein said reset device comprises a logic operational element having a logic operational element delay time, said logic operational element having a reference input signal and said first logic device output control signal as inputs for generating said reset signal to reset said first logic device, such that said width of said rest signal is about equal to at least said logic operational element delay time.

7. The phase locked loop device of claim 6, wherein said logic operational element generates said reset signal.

8. The phase locked loop device of claim 6, wherein said logic operational element comprises a logical AND gate.

9. The phase locked loop device of claim 8, wherein said voltage controlled oscillator, said first logic device, and said reset device are formed on a singular substrate.

10. The phase locked loop device of claim 6, further comprising a filter for filtering said output control signal between said first logic device and said voltage controlled oscillator.

11. A phase locked loop device comprising:

a first logic state device for generating a first logic state device output signal and for generating an inverse first logic state device output signal responsive to a voltage controlled oscillator signal from a voltage controlled oscillator, said first logic state device comprising:

a phase detector comprising:

a first logic state device data input, the first logic state device data input receiving said inverse first logic state device output signal;

a first reference input; and a first logic state device reset control signal, responsive to a reset signal, having a pulse width, for resetting said first logic state device;

a reset device for generating said reset signal to reset said first logic state device on an edge of an input coordination signal, said reset device comprising:

a reset device data input, the reset device data input having a substantially constant voltage input;

a logical operation gate for performing a logical operation on said first reference input and said substantially constant voltage input to generate a logical operation gate output;

a reset device clock input, the reset device clock input receiving said logical operation gate output; and a reset control signal, responsive to said reset signal, for resetting said first logic state device and said reset device, such that said reset signal has said pulse width corresponding with a delay time between said first logic state device reset control and said reset signal.

12. The phase locked loop device of claim 11, said phase detector further having:

a D-type flip flop having a set control and a reset control;

a first logical AND gate for logically ANDing said voltage controlled oscillator output with said first logic state device output signal to generate a first logical AND output which is input to said set control;

a second logical AND gate for logically ANDing an inverse of said first logic state device output signal with said voltage controlled oscillator output signal to generate a second logical AND output which is input to said reset control; and a clock input coupled with a data input to a logical low level for substantially minimizing the skew of the phase detector.

13. The phase locked loop device of claim 11, further comprising a low pass filter for filtering said first logic state device output signal between said first logic state device and said first and second logical AND gates.

14. The phase locked loop device of claim 11, wherein said first logic state device comprises a D-type flip flop.

15. The phase locked loop device of claim 14, wherein said a logical operation gate comprises a logical AND gate.

16. The phase locked loop device of claim 14, wherein said logical operation gate, said first and second logical AND gates, and said D-type flip flop minimize the skew rate of the phase detector.

17. The phase locked loop device of claim 16, wherein said voltage controlled oscillator, said first logic state device, and said reset device are formed on a singular substrate.

* * * * *